United States Patent
Chan et al.

(10) Patent No.: US 8,915,603 B2
(45) Date of Patent: Dec. 23, 2014

(54) COOLING SYSTEM UTILIZING POTENTIAL ENERGY

(71) Applicant: Avago Technologies General IP (Singapore) Pte. Ltd., Singapore (SG)

(72) Inventors: Chuan Hoe Chan, Perak (MY); Ju Chin Poh, Penang (MY); Kheng Leng Tan, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 179 days.

(21) Appl. No.: 13/706,130

(22) Filed: Dec. 5, 2012

(65) Prior Publication Data

US 2014/0153219 A1  Jun. 5, 2014

(51) Int. Cl.
*F21V 33/00* (2006.01)
*F21V 29/00* (2006.01)
*F28F 1/10* (2006.01)
*F28F 9/007* (2006.01)
*F21Y 101/02* (2006.01)

(52) U.S. Cl.
CPC .............. *F21V 29/405* (2013.01); *F28F 1/10* (2013.01); *F21Y 2101/02* (2013.01); *F28F 9/007* (2013.01); *F21V 29/2243* (2013.01)
USPC .............................................. 362/92; 165/67

(58) Field of Classification Search
USPC .............................................. 362/92; 165/67
See application file for complete search history.

(56) References Cited

U.S. PATENT DOCUMENTS

| 5,483,131 A | 1/1996 | Ito |
| 6,632,405 B2 | 10/2003 | Lua |

FOREIGN PATENT DOCUMENTS

| CN | 201710970 | 1/2011 |
| JP | 2011130891 | 7/2011 |

OTHER PUBLICATIONS

Owen, "Solar Pendulum", available at http://www.accomplished.org/2010/06/02/solar-pendulum/, posted Jun. 2, 2010, updated Jun. 24, 2011, accomplished.org, 11 pages.

*Primary Examiner* — Vip Patel (57) ABSTRACT

A cooling system utilizing a potential energy that provides cooling with low power consumption is disclosed. The cooling system may comprise a heat dissipating member, a support structure, a movable assembly, and a coil. In one embodiment, the movable assembly may be configured to oscillate above the heat dissipating member by utilizing induction from the coil and the potential energy to generate air flow that provide cooling on the heat dissipating member. In other embodiments, the movable assembly may be configured to oscillate substantially within the recess of the heat dissipating member.

20 Claims, 6 Drawing Sheets

COOLING SYSTEM UTILIZING POTENTIAL ENERGY

BACKGROUND

Electronic systems may produce heat during its operation. When the heat is not adequately removed, it may cause premature failure and other reliability issues in the systems. Good thermal management may remove the heat to ensure that the electronic systems are able to perform in an efficient operating condition. This can in turn improve the lifetime of the systems.

There are various thermal management schemes that have been developed to ensure the electronic systems are sufficiently cool. One such scheme is passive cooling. Passive cooling is a thermal management scheme, which does not consume power to remove the heat. It is used in the microprocessors for computers and other electronic devices.

In some circumstances where passive cooling may not be sufficient or suitable to remove the heat, an active cooling scheme may be considered. It might be more effective to implement an active cooling scheme to cool the system. However, it also has its own drawbacks such as it may increase the overall power consumption of the electronic system.

BRIEF DESCRIPTION OF THE DRAWINGS

Illustrative embodiments by way of examples, not by way of limitation, are illustrated in the drawings. Throughout the description and drawings, similar reference numbers may be, but not necessarily, used to identify similar elements. The drawings are for illustrative purpose to assist understanding and may not be drawn per actual scale.

DETAILED DESCRIPTION

Figure 1A:
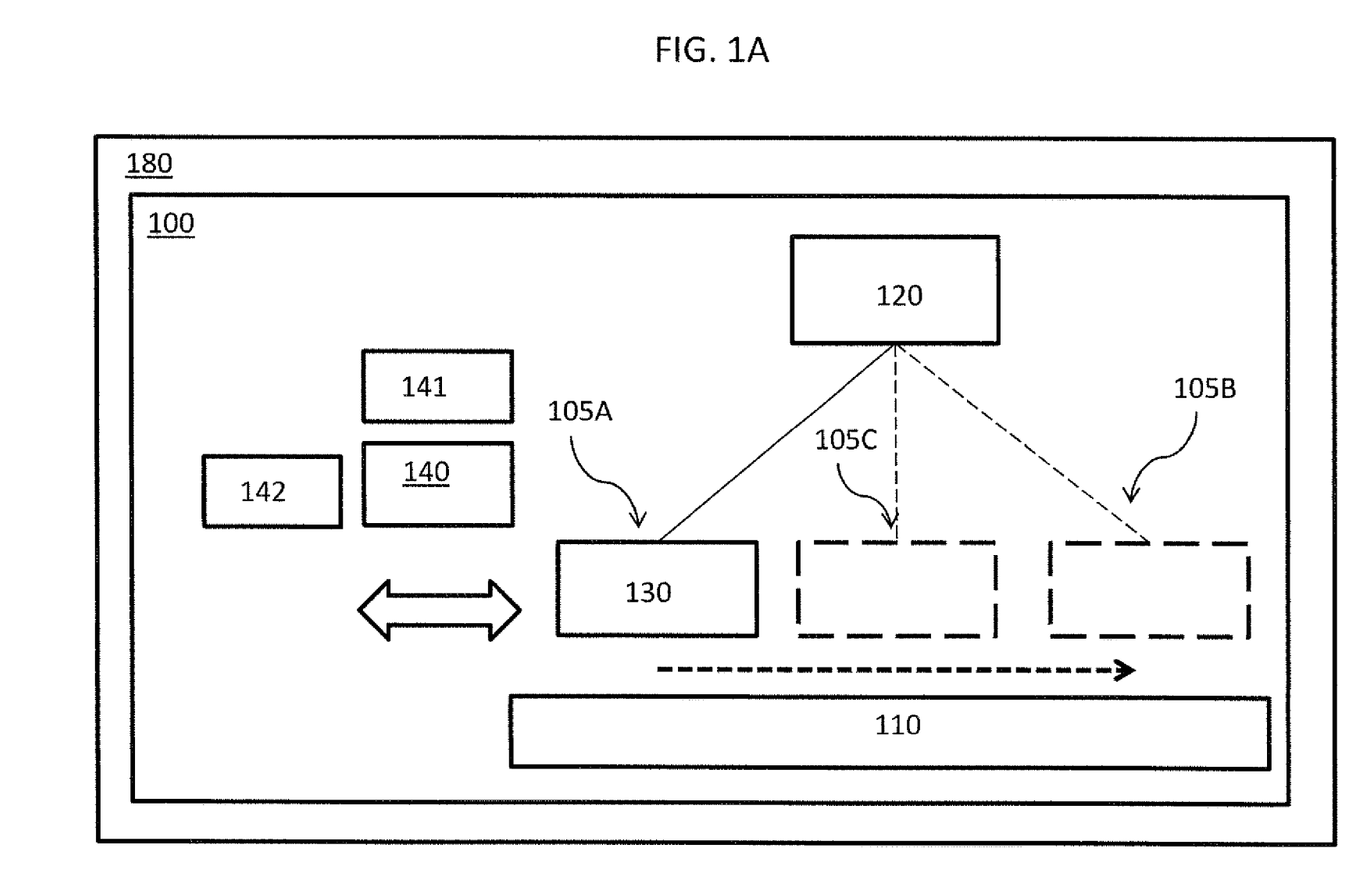
FIG. 1A illustrates a block diagram of a cooling system.
Figure 1B:
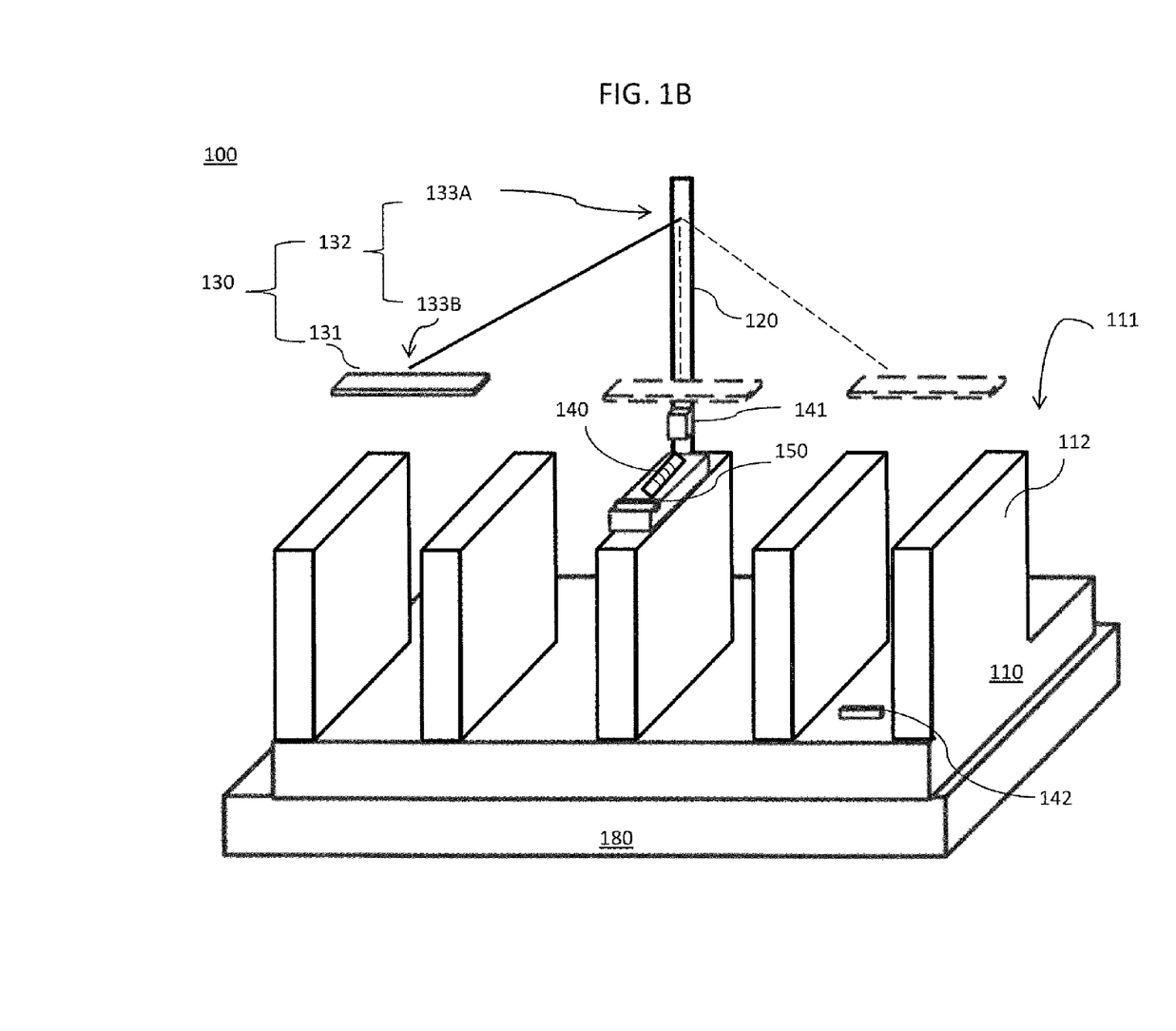
FIG. 1B illustrates an isometric view of the cooling system shown in FIG. 1A.

FIG. 1A-1B illustrates an embodiment of a cooling system 100. The cooling system 100 may comprise a heat dissipating member 110, a support structure 120, a movable assembly 130, and a coil 140. The cooling system 100 may be configured to form a portion of an electronic device 180. In one embodiment, the electronic device 180 may be a lighting system. In another embodiment, the cooling system 100 may be configured to form a portion of a photonic device or other device that requires effective thermal management for its operation, by heat conduction. In one embodiment, the heat dissipating member 110 may comprise a plurality of fins 111. The heat dissipating member 110 may comprise metal. Metal may comprise a majority of material of the heat dissipating member 110. The heat dissipating member 110 may be made from aluminum, copper, or any other material that may be configured to transfer the heat away from the electronic device 180.

In one embodiment, the movable assembly 130 may be a pendulum assembly 130. The pendulum assembly 130 may further comprise a pendulum weight 131 and an elongated member 132 as shown in FIG. 1B. The elongated member 132 may be made from metal, wood, composites or any other material suitable to hold the pendulum weight 131. The elongated member 132 may have first and second opposing extremities 133A, 133B. The first extremity 133A of the elongated member 132 may be coupled with the support structure 120. The second extremity 133B of the elongated member 132 may be coupled with the pendulum weight 131. In one embodiment, the pendulum weight 131 may be made from a material that exhibits magnetic properties. For example, the pendulum weight 131 may be ferromagnetic and may be made from iron, cobalt, or nickel. The pendulum weight 131 may comprise metal. Metal may comprise a majority of material of the pendulum weight 131. The pendulum weight 131 may be defined in a spherical, cylindrical or any other shape that substantially limits air resistance during the oscillation of the pendulum assembly 130.

The movable assembly 130 may be configured to be pivotally coupled with the support structure 120. The movable assembly 130 may be arranged adjacent to the heat dissipating member 110 such that the oscillation of the movable assembly 130 may be able to cool the heat dissipating member 110 by generating an air flow. For example, in the embodiment shown in FIG. 1B, the heat dissipating member 110 may be arranged below the movable assembly 130 such that the air flow generated may provide cooling on the heat dissipating member 110. In one embodiment, the movable assembly 130 may be configured to move in a transverse direction with respect to a major surface 112 of at least one of the plurality of fins 111. In another embodiment, the movable assembly 130 may be configured to move in a longitudinal direction with respect to a major surface 112 of at least one of the plurality of fins 111.

The coil 140 may be configured to be inductively coupled with the movable assembly 130. The coil 140 may comprise a plurality of turns of wire surrounding a core in a spiral, toroidal, or any other shape capable of generating inductance. In one embodiment, the coil 140 may also be a device that is capable of generating magnetic field. The core of the coil 140 may be substantially magnetic. The coil 140 may be configured to draw electrical energy from an energy harvesting device 150, which will be described in more detail in the following paragraphs.

In the embodiment shown in FIG. 1A, the movable assembly 130 may be configured to oscillate between second position 105A and third position 105B. The coil 140 may be arranged adjacent to the movable assembly 130 at the first position 105C such that the coil 140 may initiate the oscillation of the movable assembly 130 by producing magnetic field as shown by the bidirectional arrow. In another embodiment, the coil 140 may be arranged adjacent to the movable assembly 130 at the second position 105A, the third position 105B, or any other position where the coil 140 may produce magnetic field to oscillate the movable assembly 130.

In the embodiment shown in FIG. 1A, the coil 140 may be configured to convert the electrical energy and produce magnetic field to enable the movable assembly 130 to oscillate from the first position 105C to the second position 105A. At the second position 105A, the movable assembly 130 may have maximum potential energy to enable the movable assembly 130 to oscillate back to the first position 105O. At the first position 105C, the coil 140 may produce magnetic field to induce the movable assembly 130 to oscillate from the first position 105O to the third position 105B. At the third position 105B, the movable assembly 130 may have the maximum potential energy to return to the first position 105C. The oscillation of the movable assembly 130 from the first position 105C to the second position 105A or the third position 105B may generate cooling air flow on the heat dissipating member 110 and remove the heat.

It may be noted that the oscillation of the movable assembly 130 may draw from the potential energy at the second position 105A or the third position 105B. The potential energy may be gravitational potential energy. The utilization of potential energy by the movable assembly 130 may substantially limit reliance on the coil 140 for operation of the cooling system 100. By substantially limiting reliance on the coil 140, draw of electrical power by the coil 140 from a power source may be substantially limited and overall power consumption of the cooling system 100 may be substantially limited.

In another embodiment, the cooling system 100 may comprise a plurality of the movable assemblies 130 and a plurality of the coils 140. The plurality of the movable assemblies 130 and the plurality of the coils 140 may be configured in an array to multiply the generation of the cooling air.

In one embodiment, the cooling system 100 may comprise a sensor 141 that may be configured to sense the presence of the movable assembly 130 at the first position 105C. The sensor 141 may be a secondary coil, a proximity sensor or other device that is capable to detect the presence of the movable assembly 130. When the presence of the movable assembly 130 is detected, the sensor 141 may be electrically coupled with the coil 140 to activate the coil. When the coil 140 is activated, the coil 140 may produce magnetic field to induce the movable assembly 130 to oscillate.

In another embodiment, the cooling system 100 may comprise a temperature sensor 142 to monitor the temperature on the heat dissipating member 110. The temperature sensor 142 may provide feedback to the coil 140 to increase or decrease the oscillation frequency of the movable assembly 130 where the heat exceeds or falls below a predetermined value. When the temperature sensor 142 senses that the temperature of the heat dissipating member 110 is increasing, the temperature sensor 142 may activate the coil 140 to increase the oscillation frequency of the movable assembly 130.

In the event that the temperature does not decrease after the increase in the oscillation frequency of the movable assembly 130, the temperature sensor 142 may be configured to provide indication that there may be fault in the cooling system 100. The cooling system 100 may then be investigated. Faulty element, if any, may be replaced to ensure the overall reliability of the cooling system 100.

In the embodiment shown in FIG. 1B, the energy harvesting device 150 may be configured to convert an otherwise lost form of energy to electrical energy. The energy harvesting device 150 may be a photovoltaic cell, a thermo electric device, a piezoelectric device or any other device that is capable to harvest the otherwise lost form of energy and convert it to electrical energy. The energy harvesting device 150 may be coupled with the coil 140 for supplying electrical energy to the coil 140 so as to drive an inductance of the coil 140.

In one embodiment, the energy harvesting device 150 may be arranged in an array and distributed across the cooling system 100 to optimize the energy harvesting depending on the type of lost energy that it is capturing. In another embodiment, the energy harvesting device 150 may be the photovoltaic cell and the photovoltaic cell may be configured to be placed adjacent to a position where it is able to capture stray lights optimally from an illuminator. In yet another embodiment, the energy harvesting device 150 may be the thermo electric device and the thermo electric device may be arranged adjacent to the heat dissipating member 110 to capture otherwise waste heat.

Figure 2:
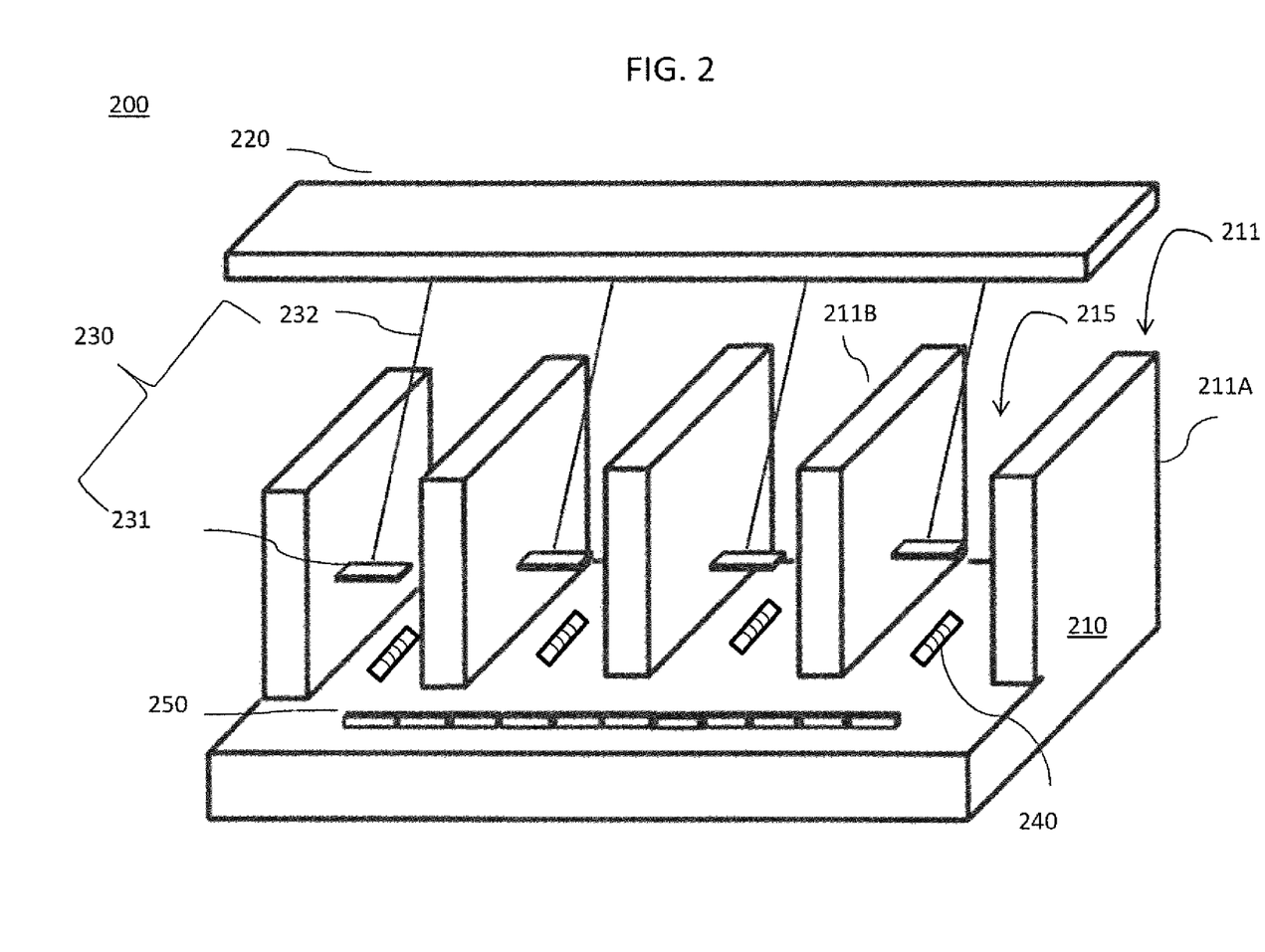
FIG. 2 illustrates an isometric view of a cooling system with a movable assembly disposed within the recess of a heat dissipating member.

FIG. 2 shows an alternative embodiment of a cooling system 200. The cooling system 200 may comprise a heat dissipating member 210, a support structure 220, a movable assembly 230, a coil 240, and an energy harvesting device 250.

The heat dissipating member 210 may comprise a plurality of fins 211. The heat dissipating member 210 may have a recess 215 extending into the heat dissipating member 210. The recess 215 may be interposed between a pair of members 211A, 211B of the plurality of fins 211 of the heat dissipating member 210.

The movable assembly 230 may be pivotally coupled to the support structure 220. The movable assembly 230 may be disposed substantially within the recess 215 of the heat dissipating member 210. The movable assembly 230 may comprise a pendulum assembly 230 disposed substantially within the recess 215 of the heat dissipating member 210. The pendulum assembly 230 may comprise a pendulum weight 231 and an elongated member 232.

In one embodiment, the pendulum assembly 230 may be configured to generate an air flow substantially within the recess 215 of the heat dissipating member 210. This configuration may allow the pendulum assembly 230 to cool an internal surface of the heat dissipating member 210.

In the embodiment shown in FIG. 2, the movable assembly 230 may comprise a plurality of pendulum assemblies 230. The plurality of pendulum assemblies 230 may be pivotally connected to the support structure 220. In one embodiment, the support structure 220 may comprise a single flat structure, which may be configured to be suspended with sufficient height above the plurality of fins 211, so as to provide for the movable assembly 230 oscillating freely within the recess 215 of the heat dissipating member 210. In another embodiment, the support structure 220 may be configured to extend from one end to the other end of the heat dissipating member 210, so as to provide for a plurality of pendulum assemblies 230 to be pivotally coupled to one support structure 220.

In the embodiment shown in FIG. 2, the coil 240 may comprise a plurality of coils 240. An individual member of the plurality of coils 240 may be arranged adjacent to the individual member of the plurality of pendulum weights 231 and disposed within the recess 215 of the heat dissipating member 210. The oscillation of the plurality of the pendulum assemblies 230 may generate an air flow within the recess 215 of the heat dissipating member 210. The air flow generated by the movable assembly 230 may enable localized cooling for individual members of the plurality of fins 211.

Figure 3:
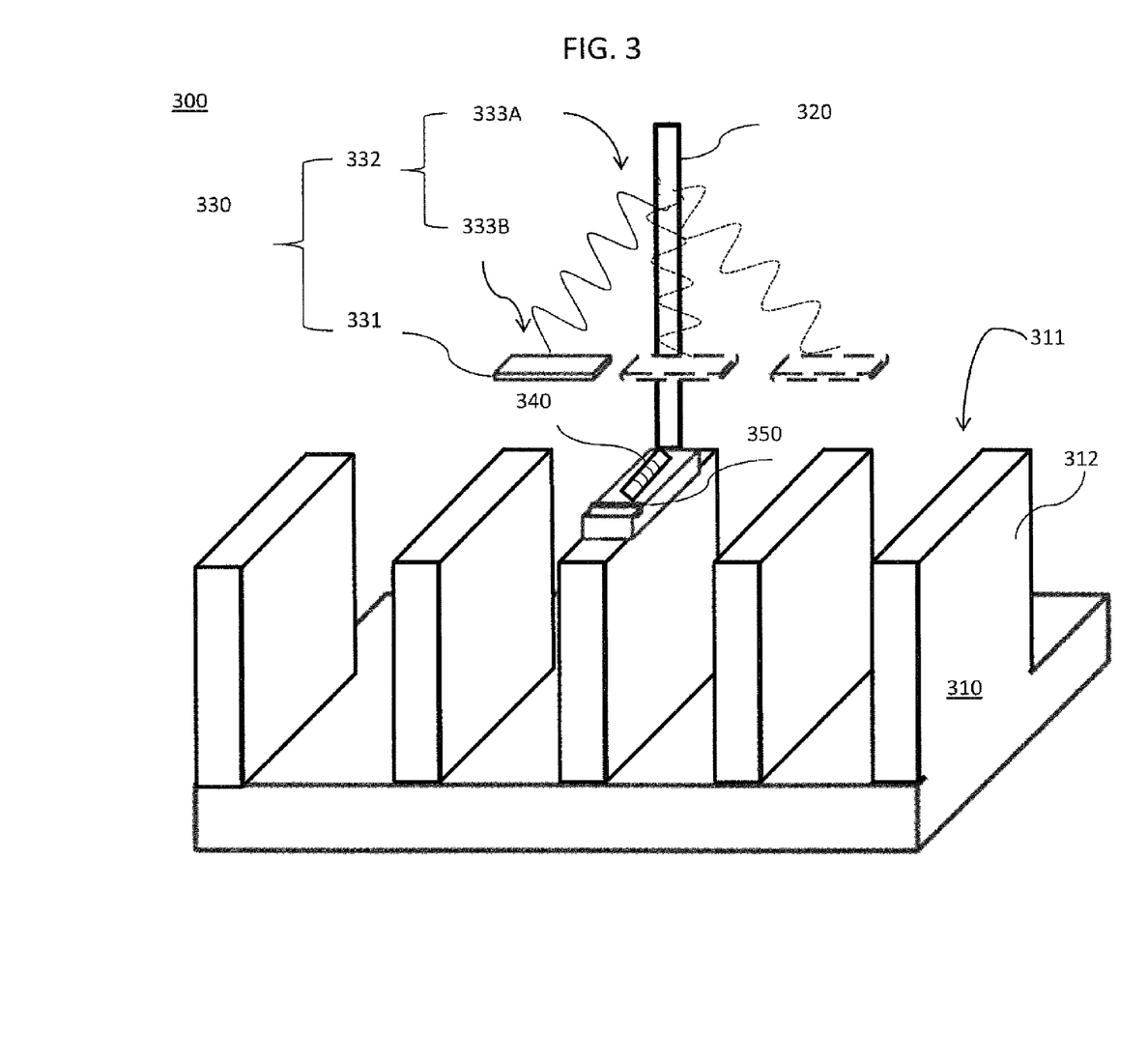
FIG. 3 illustrates an isometric view of a cooling system with a resilient member.

FIG. 3 shows an embodiment of a cooling system 300. The cooling system 300 may comprise a heat dissipating member 310, a support structure 320, a movable assembly 330, a coil 340, and an energy harvesting device 350. The heat dissipating member 310 may comprise a plurality of fins 311. The pendulum assembly 330 may comprise a pendulum weight 331 and a resilient member 332.

The resilient member 332 may have first and second opposing extremities 333A, 333B. The first extremity 333A of the resilient member 332 may be coupled with the support structure 320. The pendulum weight 331 may be coupled with the second extremity 333B of the resilient member 332. In one embodiment, the resilient member 332 may comprise a spring 332.

In the embodiment shown in FIG. 3, the movable assembly 330 may be arranged above the heat dissipating member 310 such that the oscillation of the movable assembly 330 may provide cooling on the heat dissipating member 310. In one embodiment, the movable assembly 330 may be configured to move in a transverse direction with respect to a major surface 312 of the plurality of fins 311. In another embodiment, the movable assembly 330 may be configured to move in a longitudinal direction with respect to at least one major surface 312 of the plurality of fins 311.

Figure 4:
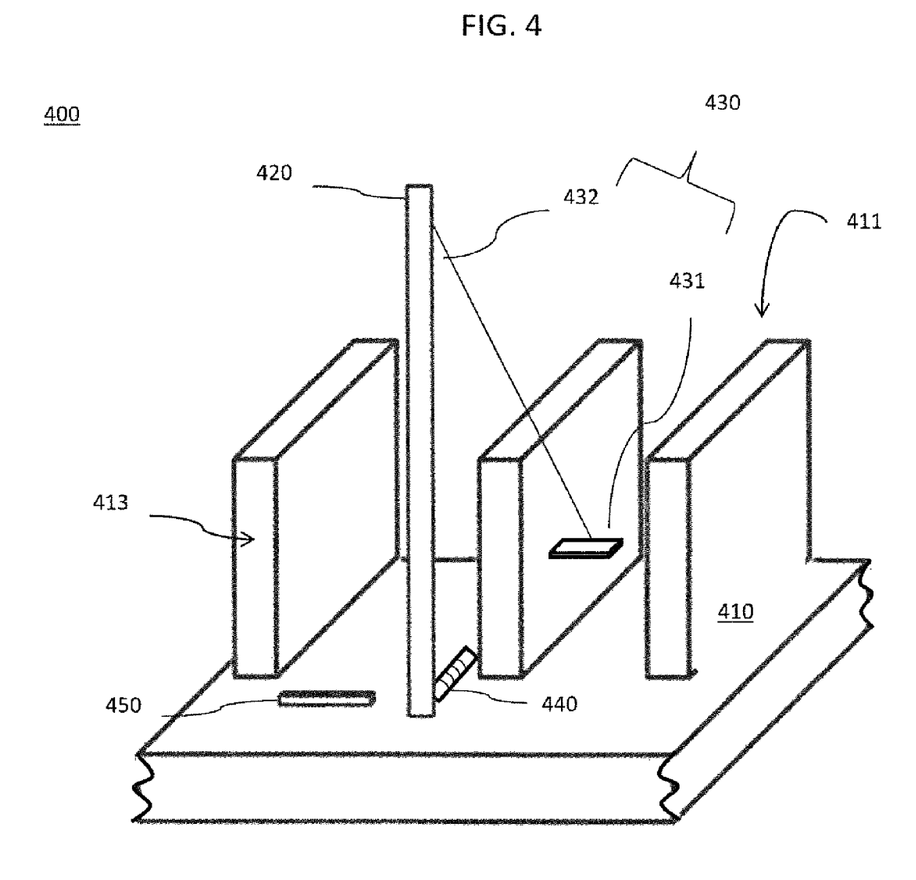
FIG. 4 illustrates a cutaway isometric view of a cooling system with a movable assembly arranged at a side of a heat dissipating member.

FIG. 4. Illustrates an embodiment of a cooling system 400. The cooling system 400 may comprise a heat dissipating member 410, a support structure 420, a movable assembly 430, a coil 440, and an energy harvesting device 450.

In one embodiment, the heat dissipating member 410 may comprise a plurality of fins 411. The movable assembly 430 may comprise a pendulum assembly 430. The pendulum assembly 430 may further comprise a pendulum weight 431 and an elongated member 432. The movable assembly 430 may be arranged adjacent to a side surface 413 of the plurality of fins 411 as shown in FIG. 4.

In one embodiment, the moving assembly 430 may comprise a plurality of pendulum assemblies (not shown). The plurality of pendulum assemblies may be arranged adjacent to the side surface 413 or other side surfaces of the heat dissipating member 410. It may be noted that the embodiment of the cooling system 400 may provide a smaller size advantage in a situation where there may be a vertical space restriction in coupling the cooling system 400 to an electronic device (not shown).

Figure 5:
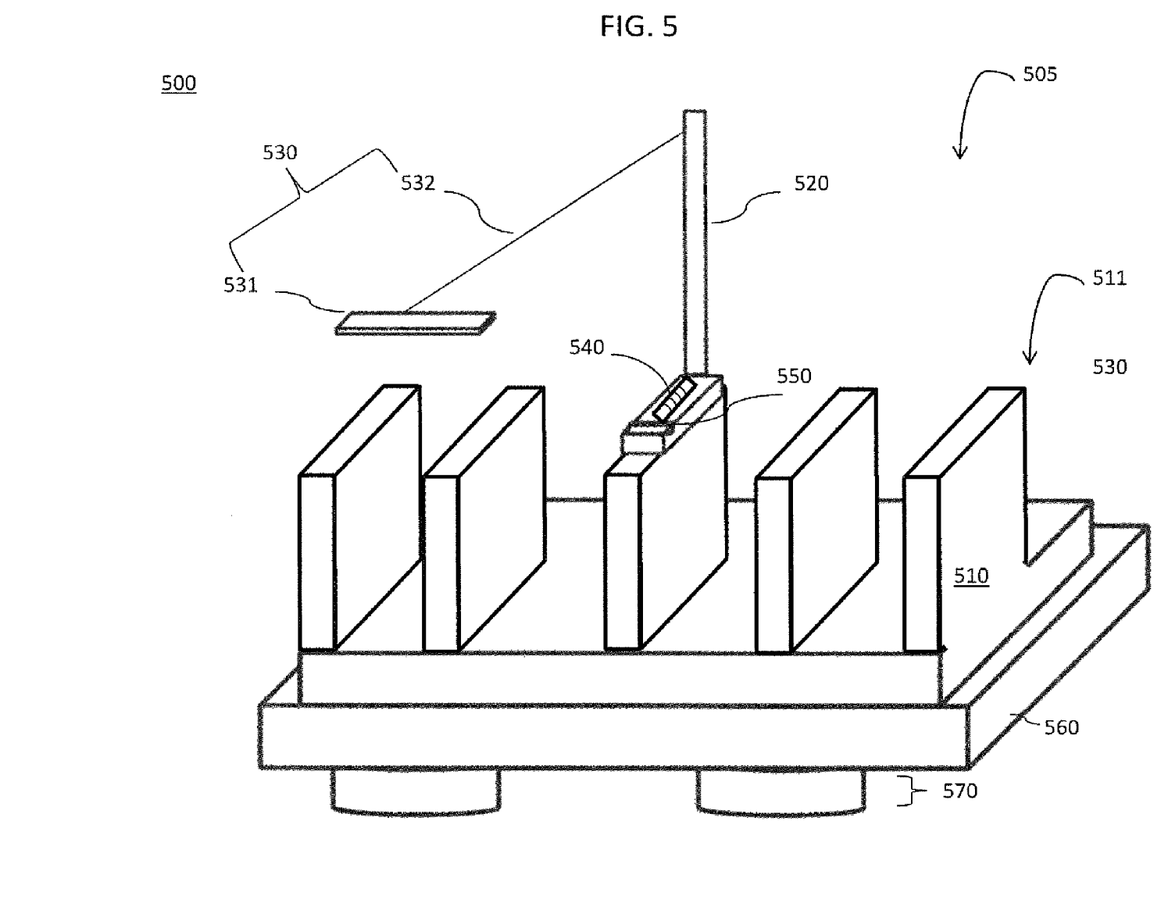
FIG. 5 illustrates an isometric view of a lighting system.

FIG. 5 shows an embodiment of a lighting system 500. The lighting system 500 may comprise a body 560, an illuminator 570, and a cooling system 505. The illuminator 570 may be disposed within the body 560. The illuminator 570 may be a solid state light source, an incandescent light source, or other device that is capable of emitting light. The solid state light source may be an LED light source or other semiconductor based light source.

The cooling system 505 may comprise a heat dissipating member 510, a support structure 520, a movable assembly 530, and a coil 540. The heat dissipating member 510 may be coupled with the body 560 for cooling the illuminator 570 disposed within the body 560. In one embodiment, the heat dissipating member 510 may comprise a plurality of fins 511.

In the embodiment shown in FIG. 5, the heat dissipating member 510 may be interposed between the body 560 and the movable assembly 530. The movable assembly 530 may comprise a pendulum assembly 530. The pendulum assembly 530 may further comprise a pendulum weight 531 and an elongated member 532.

The movable assembly 530 may be pivotally coupled with the support structure 520. In one embodiment, the movable assembly 530 may be arranged adjacent to the heat dissipating member 510. The coil 540 may be inductively coupled with the movable assembly 530 to oscillate the movable assembly 530.

In one embodiment, the heat dissipating member 510 may transfer the heat from the illuminator 570 to the surrounding air. The oscillation of the movable assembly 530 may generate an air flow on the heat dissipating member 510. The air flow generated by the movable assembly 530 may assist to cool the heat dissipating member 510 through convection, thereby providing an effective thermal management for the lighting system 500. The convection cooling generated by the oscillation of the movable assembly 530 may reduce a size of the heat dissipating member 510 relative to what may otherwise be needed if passive cooling were used instead of active cooling. For example, a relatively smaller heat dissipating member 510 using active cooling of the moveable assembly 530 may cool the heat generated by the lighting system 500, thereby reducing the overall footprint of the lighting system 500.

In the embodiment shown in FIG. 5, the cooling system 505 may further comprise an energy harvesting device 550. The energy harvesting device 550 may be a photo voltaic cell, thermo electric device, piezoelectric device or any other device capable of converting otherwise lost form of energy to electrical energy. The energy harvesting device 550 may be coupled with the coil 540 for supplying the electrical energy to the coil 540 so as to drive an inductance of the coil 540.

In one embodiment, the utilization of the energy harvesting device 550 may provide sufficient power, so that in some embodiments an external power source to supply electrical power to the cooling system 505 may not be needed. This may result in an efficient power consumption to operate the lighting system 500. In the same time, it may provide higher reliability and longer lifetime for the illuminator 570 by dissipating the heat effectively.

In another embodiment, the lighting system 500 may be configured to be modular. When one of the elements is faulty, the modular arrangement of the lighting system 500 may allow it to be replaced without the need to replace the rest of the elements of the lighting system 500. Consequently, the modularity may assist in the preventive maintenance of the lighting system 500.

Different aspects, embodiments or implementations may, but need not, yield one or more of the advantages. For example, the utilization of the energy harvesting device may produce more cooling air without increasing power consumption. Pivotal coupling, for example, pivotal coupling of the pendulum assembly may provide for compactness and may provide for efficient use of potential energy in cooling, for example, of the electronic device and/or illuminator.

Although specific embodiments of the invention have been described and illustrated herein above, the invention should not be limited to any specific forms or arrangements of parts so described and illustrated. For example, illuminator described above may be a solid state light source or some other future light source as known or later developed without departing from the spirit of the invention. Similarly, although certain orientation terms such as "above", "below", and "side" were used, the scope should not be limited to such orientation. The scope of the invention is to be defined by the claims.

What is claimed is:

1. A cooling system, comprising:
   a heat dissipating member;
   a support structure;
   a movable assembly pivotally coupled with the support structure and arranged adjacent to the heat dissipating member; and
   a coil inductively coupled with the movable assembly and configured to oscillate the movable assembly such that the movable assembly moves from first position to second position and acquires potential energy at the second position to move back to the first position, wherein the movable assembly is configured to generate a cooling air flow on the heat dissipating member.

2. The cooling system of claim 1, wherein the heat dissipating member comprises a plurality of fins.

3. The cooling system of claim 1, wherein the movable assembly comprises a pendulum assembly.

4. The cooling system of claim 3, wherein the pendulum assembly comprises:
   a pendulum weight; and
   an elongated member having first and second opposing extremities, wherein the first extremity of the elongated member is coupled with the support structure, and the pendulum weight is coupled with the second extremity of the elongated member.

5. The cooling system of claim 3, wherein the pendulum assembly comprises:

a pendulum weight; and a resilient member having first and second opposing extremities, wherein the first extremity of the resilient member is coupled with the support structure, and the pendulum weight is coupled with the second extremity of the resilient member.

6. The cooling system of claim 1, further comprising a plurality of movable assemblies, wherein the plurality of the movable assemblies are configured in an array to multiply the generation of the cooling air.

7. The cooling system of claim 1, further comprising a sensor, wherein the sensor is configured to detect the presence of the movable assembly.

8. The cooling system of claim 1, further comprising an energy harvesting device configured to collect an otherwise lost form of energy and configured to convert the otherwise lost form of energy to electrical energy, wherein the energy harvesting device is coupled with the coil for transmitting the electrical energy to the coil so as to drive an inductance of the coil.

9. The cooling system of claim 1, further comprising a temperature sensor, wherein the temperature sensor is configured to sense temperature of the heat dissipating member and provide feedback to the coil.

10. The cooling system of claim 1, wherein the heat dissipating member is arranged below the movable assembly.

11. The cooling system of claim 2, wherein the movable assembly is configured to move in a longitudinal direction with respect to a major surface of at least one of the plurality of fins.

12. The cooling system of claim 2, wherein the movable assembly is configured to move in a transverse direction with respect to a major surface of at least one of the plurality of fins.

13. The cooling system of claim 1, wherein the movable assembly is arranged adjacent to a side of the heat dissipating member.

14. The cooling system of claim 1, wherein the cooling system is a portion of an electronic device.

15. A cooling system, comprising:

a heat dissipating member having a recess extending into the heat dissipating member;

a support structure;

a movable assembly pivotally coupled with the support structure, wherein the movable assembly is disposed substantially within the recess of the heat dissipating member; and a coil inductively coupled with the movable assembly and configured to oscillate the movable assembly such that the movable assembly moves from first position to second position and acquires potential energy at the second position to move back to the first position, wherein the movable assembly is configured to generate an air flow substantially within the recess of the heat dissipating member.

16. The cooling system of claim 15, wherein the movable assembly comprises a pendulum assembly disposed substantially within the recess of the heat dissipating member.

17. The cooling system of claim 15, wherein the heat dissipating member comprises a plurality of fins and wherein the recess is interposed between a pair of members of the plurality of fins of the heat dissipating member.

18. A lighting system comprising:

a body;

an illuminator disposed within the body;

a heat dissipating member coupled with the body for cooling the illuminator disposed within the body;

a support structure;

a movable assembly pivotally coupled with the support structure and arranged adjacent to the heat dissipating member; and a coil inductively coupled with the movable assembly and configured to oscillate the movable assembly such that the movable assembly moves from a first position to a second position and acquires potential energy at the second position to move back to the first position, wherein the movable assembly is configured to generate an air flow on the heat dissipating member.

19. The lighting system of claim 18, wherein the illuminator comprises a solid state light source.

20. The lighting system of claim 18, wherein the heat dissipating member is interposed between the body and the movable assembly.

* * * * *